United States Patent [19]

Rust

[11] Patent Number: 5,794,135
[45] Date of Patent: Aug. 11, 1998

[54] MILLIMETER WAVE MIXER REALIZED BY WINDOWING

[75] Inventor: Stefan Rust, Senden, Germany

[73] Assignee: Daimler-Benz Aerospace AG, Munich, Germany

[21] Appl. No.: 619,639

[22] PCT Filed: Jul. 19, 1994

[86] PCT No.: PCT/EP95/02844

§ 371 Date: Mar. 27, 1996

§ 102(e) Date: Mar. 27, 1996

[87] PCT Pub. No.: WO96/03801

PCT Pub. Date: Feb. 8, 1996

[30] Foreign Application Priority Data

Jul. 27, 1994 [DE] Germany ............... 44 26 543

[51] Int. Cl.$^6$ ........................................ H04B 1/26
[52] U.S. Cl. ........................... 455/328; 333/250
[58] Field of Search ........................ 455/326–328, 455/330, 307; 333/248, 250, 246

[56] References Cited

U.S. PATENT DOCUMENTS

| | | | |
|---|---|---|---|
| 3,882,396 | 5/1975 | Schneider | 333/250 X |
| 4,118,670 | 10/1978 | Dickens | 455/327 |
| 4,255,730 | 3/1981 | Sekine | 333/250 |
| 4,276,655 | 6/1981 | Kraemer et al. | 455/327 |
| 4,425,549 | 1/1984 | Schwartz et al. | 333/250 |
| 4,641,369 | 2/1987 | Grote et al. | 455/327 |
| 4,661,997 | 4/1987 | Roberts | 455/327 |
| 5,115,217 | 5/1992 | McGrath et al. | 333/246 |

FOREIGN PATENT DOCUMENTS

| | | |
|---|---|---|
| 18-6295 | 7/1986 | European Pat. Off. |
| 3637827 | 5/1988 | Germany |
| 3738262 | 5/1989 | Germany |

*Primary Examiner*—Thomas Mullen
*Attorney, Agent, or Firm*—Spencer & Frank

[57] ABSTRACT

The invention concerns a millimeter wave mixer realized by windowing, and includes a coplanar conductive line (320) that is produced in plating (212) on a substrate (211) disposed in a rectangular waveguide. The coplanar line (320) divides the plating (212) into two parts. The coplanar line (320) is guided out along the narrow sides of the waveguide and is connected to each of the two parts of the plating (212) via first and second diodes (41, 42). At least two slot lines (51–54) are produced parallel to the broad sides of the waveguides in the plating (212).

11 Claims, 2 Drawing Sheets

MILLIMETER WAVE MIXER REALIZED BY WINDOWING

BACKGROUND OF THE INVENTION

The invention relates to a millimeter wave mixer realized by windowing, the mixer being of the type that includes a substrate metallized on one side in a rectangular waveguide.

Because of today's increasing demands with regard to the efficiency of millimeter wave mixers and the simultaneous demand for increasing miniaturization and because of growing cost pressures it is necessary to implement such mixers with adapted designs in new technologies.

One technology which meets these demands was already proposed and is generally described by the term "windowing". Mixers produced with this technology usually have a substrate which is metallized on one side, with the substrate being arranged in a waveguide.

Furthermore, it is generally known that, in push-pull mixers, mixer diodes for a local oscillator (LO) signal must be connected in parallel and that the high-frequency signal which is to be mixed into the intermediate frequency position must be connected in series. In the implementation of input circuits, care must therefore be taken to match the LO source resistance to half of the real diode resistance, the signal source resistance to double the real diode resistance.

Since, during this process, both signal power and LO power are supplied by the associated waveguide—whose source resistance corresponds approximately to that of the mixer diodes—a transformation ratio between source impedance and diode impedance must be realized in the LO input circuit, which ratio is larger by the factor of 4 than in the signal input circuit. Since, in the millimeter wave frequency range, the amount of the ohmic resistance of a mixer diode is usually smaller than 10 ohms and the wave impedance of commercially available waveguides amounts to approx. 400 ohms, an impedance transformation ratio of 1:80 must be realized with the LO input circuit.

This can only be realized by means of a resonance transformation. If LO waveguides and signal waveguides are removed from one another by several wavelengths, the bandwidth of the LO input circuit is reduced very quickly. Measures to improve the LO input circuit at the location of the mixer diodes usually impact the signal input circuit.

Furthermore, it is generally known that the base impedance (impedance between terminal mass and component) must be low in order to match a low-resistance component in a broadband manner to a predetermined source impedance.

It is now desirable to transfer the advantages of windowing to further modules of the millimeter wave technique, which advantages are namely the high degree of miniaturization that is possible while simultaneously complying with or simultaneously exceeding the electrical requirements that have been standard so far (high noise immunity, broadband feature, etc.).

SUMMARY OF THE INVENTION

Therefore, it is the object of the invention to propose a small millimeter wave mixer realized by windowing which can be produced without difficulty and in a material-saving and cost-advantageous manner. Furthermore, this mixer should be a broadband mixer and be immune to noise.

According to the invention, the object is solved in that a coplanar line is carved out of the metallization of the substrate, which line divides the metallization into two parts, in that the coplanar line is guided out at the narrow sides of the waveguide, in that the coplanar line is connected to each of the two parts via a first or second diode and in that at least two slot lines are carved out of the metallization parallel to the wide sides of the waveguide.

Here, it is advantageous that the mixer according to the invention is provided with a high degree of miniaturization. This considerably reduces, for example, the fabrication costs when the mixer according to the invention is mass-produced. Further advantages are the broadband feature and noise immunity.

BRIEF DESCRIPTION OF THE DRAWINGS

In the following, the invention is represented in an exemplary manner by way of the drawings, with identical reference numerals in different figures designating identical reference elements.

DESCRIPTION OF THE PREFERRED EMBODIMENT

Figure 1:
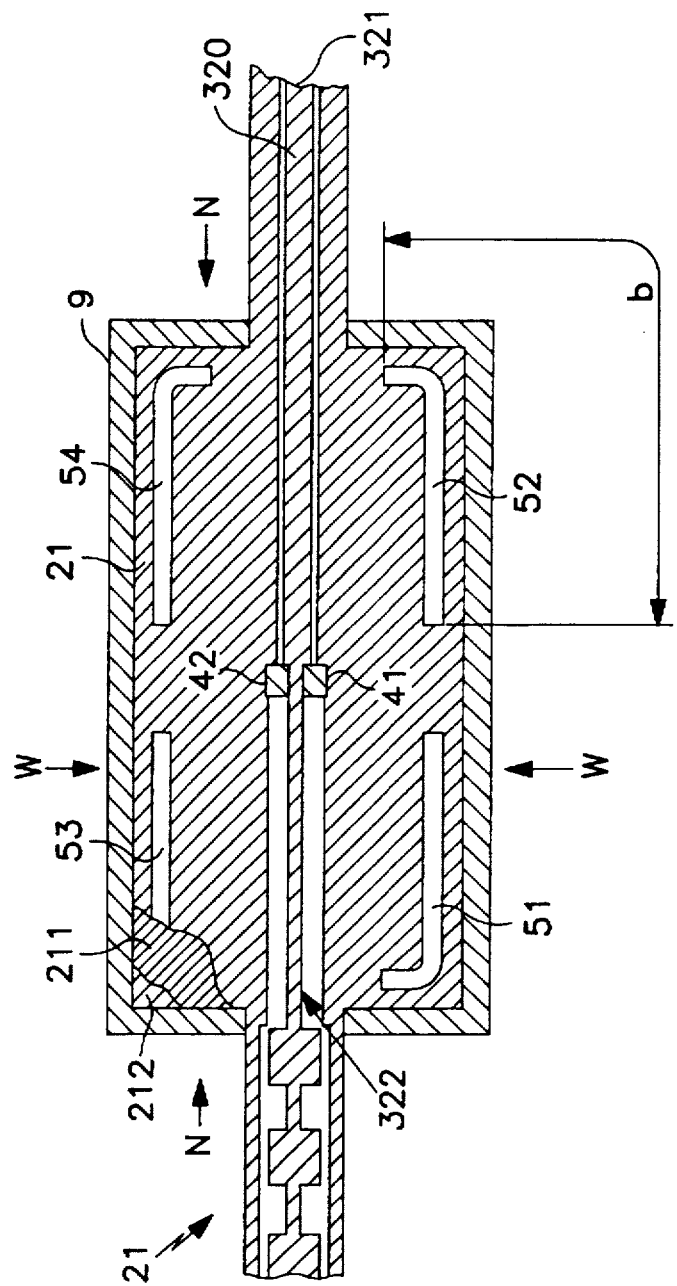
FIG. 1 shows a preferred embodiment of the millimeter wave mixer according to the invention.

The millimeter wave mixer 21 in FIG. 1 is provided with a metallization 212 on a substrate 211 which is embodied in a waveguide 9 perpendicularly to its main waveguide axis 10. As is customary in windowing, the waveguide 9 is comprised of first and second waveguide sections 11, 12 of identical orientation and identical clear width. The substrate 211 is fixed between the first and the second waveguide sections 11, 12.

The substrate 211 is guided out at the two narrow sides N of the waveguide 9. Here, the first waveguide section 11 has a waveguide short circuit 121 when seen at a small distance from the substrate 211. The distance between the short circuit of the first waveguide section 11 and the substrate 211 amounts to approximately $\lambda/4$, with $\lambda$ being the mean operating wavelength.

Figure 2:
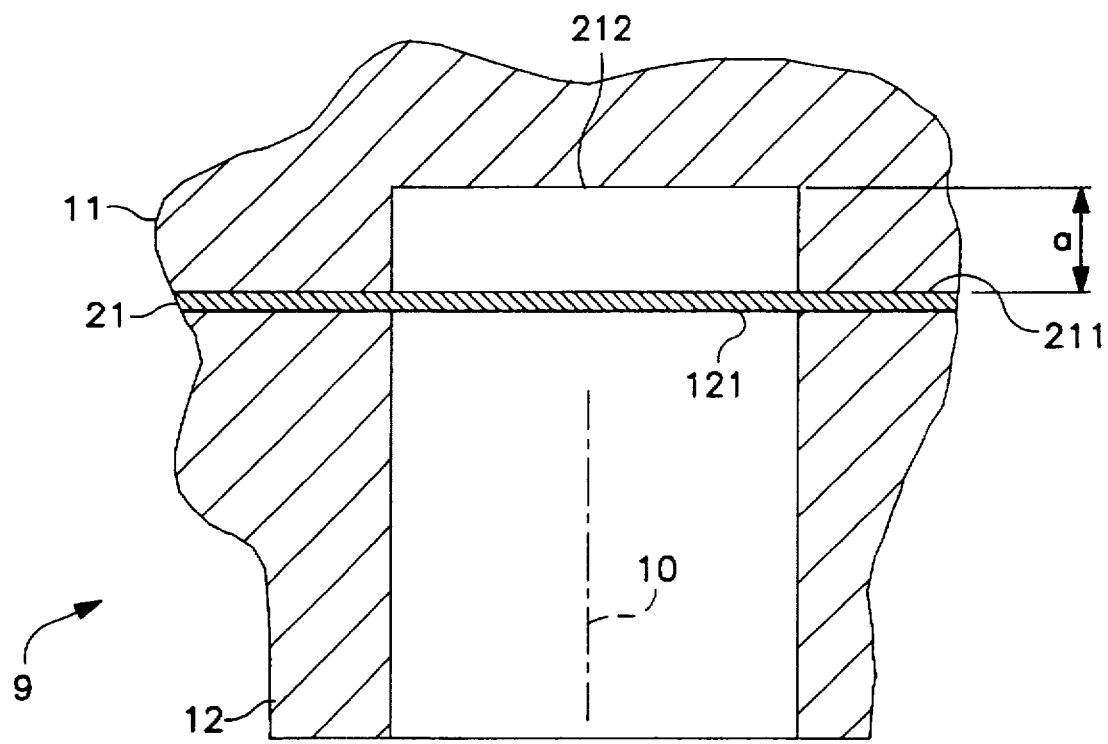
FIG. 2 shows a cross section through the preferred embodiment of the millimeter wave mixer of the invention according to FIG. 1.

In the cross-sectional representation of FIG. 2 through the preferred embodiment of the millimeter wave mixer of the invention according to FIG. 1, this distance is identified by a. As can further be seen from FIG. 1, a coplanar line 320 is carved out of the metallization 212 of the substrate 211, which coplanar line divides the metallization 212 into two parts which preferably are approximately of identical size.

The coplanar line 320 is connected to each of the two parts of the metallization 212 via a first and second diodes 41, 42.

Also from the metallization 212 there are at least two slot lines which, for example, are carved out in mirror symmetry with respect to the coplanar line 320. Particularly advantageous electrical properties result, e.g., with regard to the matching of the waveguide (12) to the mixer diodes (41, 42) if, as is shown in FIG. 1, four slot lines 51, 52, 53, 54 arranged in mirror symmetry relative to one another are carved out of the metallization 212. Here, the slot lines are implemented approximately l-shaped. The shorter leg of the l-shape respectively extends approximately parallel to one of the narrow sides N of the waveguide 9.

The longer leg of the respective l-shaped slot lines 51, 52, 53, 54 extends approximately parallel to one of the wide sides W of the waveguide 9. Furthermore, the longer legs of the slot lines 51, 52, 53, 54 are approximately parallel to the coplanar line 320. These partial sections of the l-shaped slot lines 51, 52, 53, 54 each have a length b of approximately $\lambda/2$, with $\lambda$ being the mean operating wavelength.

The coplanar line 320 in FIG. 1 is realized by first and second coplanar line portions 321, 322 in axial alignment with respect to one another, having a different line width.

Here, the cross-point is disposed approximately in the center of the substrate 211. The cross-point of the first and of the second coplanar line portions 321, 322 coincides with the cross-point of the first and second diodes 41, 42. The coupling takes place galvanically at one end of each diode. The respective diode base (other end of the diodes 41 or 42 galvanically connected to the metallization 212) of diodes 41, 42 is provided with an inductive connection opposite of the respectively closest wide side of the second waveguide section 12.

In principle, the preferred embodiment of the millimeter wave mixer according to the invention functions as follows.

An LO power is guided via the coplanar line 320 in the proximity of the diodes 41, 42 in the region within the second waveguide section 12 (signal waveguide), where, due to the sufficiently large metallized surface of the metallization 212 and its galvanic connection with the waveguide housing, the necessary low resistance of the coplanar outer conductor is accomplished. The metallic surface of the metallization 212 for the realization of the outer conductor of the coplanar line 320 of the LO lead takes up a considerable portion of the cross-sectional surface of the second waveguide section 12, which cross-sectional surface greatly limits the transmission of the signal line in the first waveguide section 11 which is short-circuited behind the mixer circuit (waveguide short circuit 121). But such a signal power portion transmitted by the circuit is needed in order to compensate the reactive power existing in the circuit in the operating frequency following reflection at the waveguide short circuit 121 of the waveguide section having a length of approximately $\lambda/4$. The slot lines 51, 52, 53, 54 are arranged in the proximity of and parallel to each of the two wide waveguide sides of the first waveguide section 11; these slot lines have a length of approximately b~$\lambda/2$ at the center frequency and are excited based on the field distribution of the first and second waveguide sections 11, 12 guiding the high-frequency signal. The electrical field generated in the center of these slots lines 51, 52, 53, 54, which are short-circuited on both sides, couples signal power into the short-circuited part of the first waveguide section 11 behind the mixer circuit, in the manner of a resonance aperture. Since the transmission is frequency-dependent during this process, the slot lines 51, 52, 53, 54 serve as tuning means in the realization of the signal input circuit. Depending on whether their length is selected such that the resonance frequency is above or below the operating frequency, a part of the mixer reactance can already be compensated with these slot lines. By integrating the length of the waveguide short circuit behind the substrate, the signal input circuit can therewith be realized in a double circuit and thus in a broadband manner.

The feeding of the two high-frequency signals (useful signal, LO signal) involved in the mixing takes place at two different points of the circuit. The useful signal coming from the antenna is fed via a waveguide in the form of a guided wave to the second waveguide section 12 (FIG. 2) and directly to the first and second mixer diode 41, 42 arranged in series (FIG. 1). Because of the serial arrangement of the first and second diode 11, 12, the mixer circuit represents a transformer for the useful signal, which transformer converts the useful signal from the waveguide impedance into the double diode impedance.

The LO signal is fed from one of the narrow sides N of the waveguide to the diodes 41, 42 via the coplanar line 320. The diodes 41, 42 are connected in parallel with respect to the coplanar line. Thus, the circuit represents a transformer for the LO signal which converts the LO signal from the line impedance present on the coplanar line into half of the diode impedance. The mixed output signal appears on the other portion of the coplanar line.

What is claimed is:

1. A millimeter wave mixer realized by windowing, comprising:

a rectangular waveguide (9) having wide sides and narrow sides;

first and second diodes (41, 42); and a substrate (211) metallized on one side in the rectangular waveguide (9), wherein a coplanar line (320) is carved out of the metallization (212) of the substrate (211), the coplanar line (320) dividing the metallization (212) into two parts, wherein the coplanar line (320) is guided out at the narrow sides of the waveguide, wherein the coplanar line (320) is connected to each of the two parts of the metallization (212) via the first and second diodes (41, 42), and wherein at least two slot lines are carved out of the metallization (212) parallel to the wide sides of the waveguide (9).

2. A mixer according to claim 1, wherein the parts of the metallization (212) are approximately of identical size.

3. A mixer according to claim 1, wherein the coplanar line (320) is formed by first and a second coplanar line portions (321, 322) which are in axial alignment with respect to one another.

4. A mixer according to claim 3, wherein the first and second coplanar line portions (321, 322) are connected to each other at a cross-point, wherein the first and second diodes (41, 42) are connected to each other at a cross-point, and wherein the cross-point of the first and of the second coplanar line portions (321, 322) is galvanically connected to the cross-point of the first and second diodes (41, 42).

5. A mixer according to claim 4, wherein the cross-points form a common cross-point that is disposed approximately in the center of the substrate (211).

6. A mixer according to claim 3, wherein at least a predominant part of the individual slot lines (51, 52, 53, 54) extends respectively parallel to the coplanar line (320).

7. A mixer according to claim 6, wherein each slot line (51, 52, 53, 54) has a length of approximately $\lambda/2$, with $\lambda$ being the mean operating wavelength.

8. A mixer according to claim 6, wherein, at least at one of their ends, the slot lines (51, 52, 53, 54) are extended further parallel to one of the narrow sides of the waveguide.

9. A mixer according to claim 6, wherein there are four slot lines (51, 52, 53, 54), and they are arranged in mirror symmetry with respect to the coplanar line (320).

10. A mixer according to claim 1, wherein the waveguide comprises a first waveguide section (11) and a second waveguide section (12), the second waveguide section (12) having a short circuit (121) which is at a distance from the substrate (211) of approximately a $\approx \lambda/4$, with $\lambda$ being the mean operating wavelength.

11. A mixer according to claim 1, wherein high frequency energy is fed in the first waveguide section (12), a local oscillator signal is fed from a narrow side of the waveguide (9) on the first coplanar line portion (321), and at the other narrow side of the waveguide (9), the mixing product of the high-frequency energy and the local oscillator signal is coupled out.

* * * * *